(12) United States Patent
Suda

(10) Patent No.: US 9,467,123 B2
(45) Date of Patent: Oct. 11, 2016

(54) RECEPTION CIRCUIT, AND RECEPTION APPARATUS

(71) Applicant: Sony Corporation, Tokyo (JP)

(72) Inventor: Satoshi Suda, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 14/581,253

(22) Filed: Dec. 23, 2014

(65) Prior Publication Data

US 2015/0244321 A1 Aug. 27, 2015

(30) Foreign Application Priority Data

Feb. 21, 2014 (JP) ................... 2014-032139

(51) Int. Cl.
*H03K 3/017* (2006.01)
*H03K 5/156* (2006.01)

(52) U.S. Cl.
CPC ............ *H03K 3/017* (2013.01); *H03K 5/1565* (2013.01)

(58) Field of Classification Search
None
See application file for complete search history.

(56) References Cited

U.S. PATENT DOCUMENTS

| 5,678,222 A * | 10/1997 | Hornak | H03D 7/00 327/113 |
| 8,717,077 B2 * | 5/2014 | Panikkath | H03L 7/08 327/175 |
| 2009/0121763 A1 * | 5/2009 | Bossu | H03K 5/1565 327/175 |
| 2009/0174459 A1 * | 7/2009 | Cicalini | H03D 7/1441 327/356 |
| 2010/0130139 A1 * | 5/2010 | Panikkath | H03L 7/08 455/76 |
| 2011/0074482 A1 * | 3/2011 | Chang | H03B 27/00 327/238 |
| 2013/0029626 A1 * | 1/2013 | Chen | H04B 15/04 455/334 |
| 2014/0120856 A1 * | 5/2014 | Liao | H03F 3/193 455/245.1 |

FOREIGN PATENT DOCUMENTS

JP 2012-065017 3/2012

* cited by examiner

*Primary Examiner* — Cassandra Cox
(74) *Attorney, Agent, or Firm* — Michael Best & Friedrich LLP

(57) ABSTRACT

There is provided a reception circuit that includes a local signal generation section, a duty-cycle correction section, an oscillation signal generation section, and a mixture section. The local signal generation section is configured to generate a local signal, the local signal being different in frequency from a modulated reception signal. The duty-cycle correction section is configured to correct a duty cycle of the generated local signal to be a predetermined value. The oscillation signal generation section is configured to generate a plurality of oscillation signals, the oscillation signals being generated using the duty-cycle-corrected local signal to vary in phase. The mixture section is configured to mix the reception signal with each of the oscillation signals.

16 Claims, 16 Drawing Sheets

RECEPTION CIRCUIT, AND RECEPTION APPARATUS

CROSS REFERENCE TO RELATED APPLICATIONS

This application claims the benefit of Japanese Priority Patent Application JP 2014-032139 filed Feb. 21, 2014, the entire contents of which are incorporated herein by reference.

BACKGROUND

The present disclosure relates to reception circuits and reception apparatuses and, more specifically, to a reception circuit and a reception apparatus for frequency conversion.

SUMMARY

With the aim of easing amplification and modulation, a reception apparatus has been converting the reception frequency of a received signal into an intermediate frequency, for example. For this frequency conversion, the reception apparatus generally generates a local signal different in frequency from the received signal, and mixes the resulting local signal with the received signal. This received signal may generate harmonics being an odd multiple of the reception frequency in an amplifier or others, and such harmonics degrade the reception quality. As a mixer capable of reducing such harmonics, a harmonic rejection mixer has been known. This harmonic rejection mixer is proposed to be mounted in a reception apparatus together with a local signal source and a ¼ frequency divider/phase shifter. As an example, refer to Japanese Patent Application Laid-Open No. 2012-65017. In this reception apparatus, the local signal source and the ¼ frequency divider/phase shifter generate three local signals LO_0, LO_45, and LO_90 with a 45-degree phase difference from each other. The harmonic rejection mixer mixes each of these local signals with the received signal, thereby generating three mixed signals. The resulting three mixed signals are combined together, and the combined result is output as an intermediate-frequency signal. With a phase difference of 45 degrees among the three local signals, the harmonics-combined vector of two of the three mixed signals is opposite in direction to the harmonics-combined vector of the remaining mixed signal so that the harmonics are cancelled out. This thus prevents harmonics from generating in the intermediate-frequency signal so that the reception quality is improved.

With the above-mentioned previous technology, however, there is a possibility of not improving the reception quality enough. This is because the duty cycle of the local signals may not take a design value, e.g., 50%, due to generation of the offset voltage or others. When the duty cycle does not take a design value, the phase difference among the local signals may not be 45 degrees. If this is the case, the harmonics-combined vector of two of the three mixed signals may not be opposite in direction to the harmonics-combined vector of the remaining mixed signal, and the harmonics are thus left without being cancelled out. The left harmonics degrade the reception quality.

It is thus desirable to improve the reception quality.

According to one embodiment of the present disclosure, there is provided a reception circuit that includes a local signal generation section, a duty-cycle correction section, an oscillation signal generation section, and a mixture section. The local signal generation section is configured to generate a local signal, the local signal being different in frequency from a modulated reception signal. The duty-cycle correction section is configured to correct a duty cycle of the generated local signal to be a predetermined value. The oscillation signal generation section is configured to generate a plurality of oscillation signals, the oscillation signals being generated using the duty-cycle-corrected local signal to vary in phase. The mixture section is configured to mix the reception signal with each of the oscillation signals. The reception circuit configured as above produces an effect that the reception signal is mixed with each of the oscillation signals that are obtained using the local signal whose duty cycle is corrected to be a predetermined value.

In the embodiment, the oscillation signal generation section may generate the oscillation signals with a phase difference of 45 degrees from each other. This produces an effect that the reception signal is mixed with each of the oscillation signals with a phase difference of 45 degrees from each other.

Also in the embodiment, the oscillation signal generation section may generate the oscillation signals with a phase difference of 90 degrees from each other. This produces an effect that the reception signal is mixed with each of the oscillation signals with a phase difference of 90 degrees from each other.

Also in the embodiment, the local signal may include a positive-phase signal and a negative-phase signal, the negative-phase signal having a phase difference of 180 degrees from the positive-phase signal. The duty-cycle correction circuit may include a delay section, a feedback section, and a voltage adjustment section. The delay section is configured to delay the positive- and negative-phase signals. The feedback section is configured to feed back the delayed positive- and negative-phase signals. The voltage adjustment section is configured to make a voltage adjustment on the positive- and negative-phase signals, the positive-phase signal being adjusted in voltage by the fed-back negative-phase signal, and the negative-phase signal being adjusted in voltage by the fed-back positive-phase signal. Such a configuration produces an effect that the positive-phase signal is adjusted in voltage by the fed-back negative-phase signal, and the negative-phase signal is adjusted in voltage by the fed-back positive-phase signal.

Also in the embodiment, the reception circuit may further include a control section configured to control a rise and fall time of each of the positive- and negative-phase signals. This produces an effect that the rise and fall time is controlled for each of the positive- and negative-phase signals.

Also in the embodiment, the control section may increase the rise and fall time with a decrease of the frequency of the local signal. This produces an effect that the rise and fall time is increased with a decrease of the local frequency of the local signal.

Also in the embodiment, the control section may obtain the rise and fall time, and when the obtained value of the time does not fall within a predetermined acceptable range, may control the value of the time to fall within the acceptable range. This produces an effect that the rise and fall time is controlled to fall within the acceptable range.

Also in the embodiment, the reception circuit may further include a temperature measurement section configured to measure a temperature of the reception circuit, and the control section may control the rise and fall time based on the measured temperature. This produces an effect that the rise and fall time is controlled based on the measured temperature.

According to another embodiment of the present disclosure, there is provided a reception apparatus that includes a local signal generation section, a duty-cycle correction section, an oscillation signal generation section, and a mixture section. The local signal generation section is configured to generate a local signal, the local signal being different in frequency from a modulated reception signal. The duty-cycle correction section is configured to correct a duty cycle of the generated local signal to be a predetermined value. The oscillation signal generation section is configured to generate a plurality of oscillation signals, the oscillation signals being generated using the duty-cycle-corrected local signal to vary in phase. The mixture section is configured to mix the reception signal with each of the oscillation signals. The reception apparatus configured as above produces an effect that the reception signal is mixed with each of the oscillation signals, which are obtained using the local signal whose duty cycle is corrected to be a predetermined value.

According to the embodiments of the present disclosure, the excellent effect of improving the reception quality can be produced. Herein, the effect described herein is not necessarily restrictive, and may be any effect described in this Specification.

These and other objects, features and advantages of the present disclosure will become more apparent in light of the following detailed description of best mode embodiments thereof, as illustrated in the accompanying drawings.

DETAILED DESCRIPTION OF EMBODIMENTS

Hereinafter, embodiments of the present disclosure (hereinafter, referred to simply as embodiments) will be described with reference to the drawings. The description is given in the following order.

1. First Embodiment (example of correcting a duty cycle)
2. Second Embodiment (example of correcting a duty cycle by control over a delay based on a local frequency)
3. Third Embodiment (example of correcting a duty cycle by control over a delay to fall within an acceptable range)
4. Fourth Embodiment (example of correcting a duty cycle by control over a delay based on a temperature)

1. First Embodiment

Exemplary Configuration of Reception Apparatus

Figure 1:
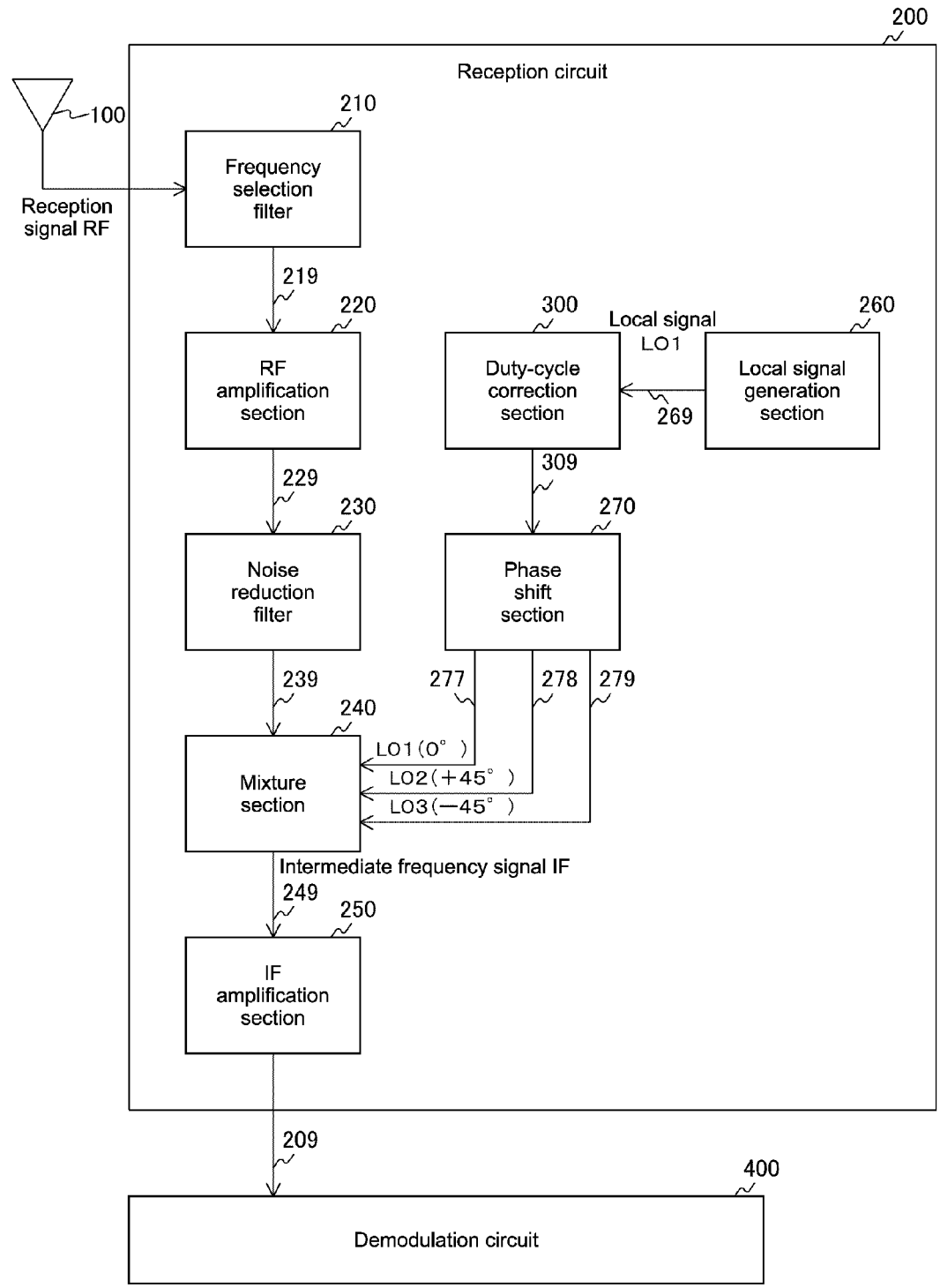
FIG. 1 is a block diagram showing an exemplary configuration of a reception apparatus in a first embodiment.

FIG. 1 is a block diagram showing an exemplary configuration of a reception apparatus in a first embodiment. This reception apparatus includes an antenna 100, a reception circuit 200, and a demodulation circuit 400. The reception circuit 200 includes a frequency selection filter 210, an RF (Radio Frequency) amplification section 220, a noise reduction filter 230, a mixture section 240, an IF (Intermediate Frequency) amplification section 250, a local signal generation section 260, a duty-cycle correction section 300, and a phase shift section 270.

The antenna 100 is for receiving a reception signal RF that is modulated in a predetermined modulation process. This antenna 100 supplies the received reception signal RF to the reception circuit 200.

The frequency selection filter 210 is for selectively passing therethrough the reception signal RF when the signal is in a specific preset frequency band. As an example, a band-pass filter is used as the frequency selection filter 210. The frequency band for signal passage is a UHF (Ultra High Frequency) band, for example. After passing through the frequency selection filter 210, the reception signal RF is supplied to the RF amplification section 220 over a signal line 219.

The RF amplification section 220 is for amplifying the reception signal RF provided by the frequency selection filter 210. This RF amplification section 220 supplies the resulting amplified reception signal RF to the noise reduction filter 230 over a signal line 229.

The noise reduction filter 230 is for noise reduction in the amplified reception signal RF. As an example, a low-pass filter is used as the noise reduction filter 230. The noise reduction filter 230 supplies the resulting noise-reduced reception signal RF to the mixture section 240 over a signal line 239.

The local signal generation section 260 is for generating a local signal LO1 with a frequency different from that of the reception signal RF. As an exemplary local signal, used is a pair of differential signals, i.e., positive- and negative-phase signals, having a phase difference of 180 degrees from each other. Such a local signal LO1 has a local frequency $F_{LO}$, which is determined both by a reception frequency $F_{RF}$ of the reception signal RF, and an intermediate frequency $F_{IF}$ of an intermediate-frequency signal IF being a target. As an example, the local signal LO1 to be generated has a local frequency $F_{LO}$ that satisfies Equation below.

$$F_{RF}-F_{LO}=F_{IF} \qquad \text{Equation 1}$$

The local signal generation section 260 supplies the resulting generated local signal LO1 to the duty-cycle correction section 300 over a signal line 269.

The duty-cycle correction section 300 is for correcting a duty cycle of the local signal LO1 to be a predetermined value, e.g., 50%. The duty-cycle correction section 300 supplies the resulting duty-cycle-corrected local signal LO1 to the phase shift section 270 over a signal line 309.

The phase shift section 270 is for shifting the phase of the local signal LO1 to generate two more local signals with a 45-degree phase difference from each other. For example, the phase shift section 270 generates a local signal LO2 with a phase shift of +45 degrees from the phase of the local signal LO1, and a local signal LO3 with a phase shift of −45 degrees from the phase of the local signal LO1. The phase shift section 270 supplies these local signals LO1, LO2, and LO3 to the mixture section 240 respectively over signal lines 277, 278, and 279. Herein, the phase shift section 270 is an example of an oscillation signal generation section claimed in Claims.

The mixture section 240 is for mixing each of these local signals LO1, LO2, and LO3 from the phase shift section 270 with the reception signal RF from the noise reduction filter 230. The mixture section 240 combines together the resulting mixed signals, and supplies the combined result, i.e., intermediate-frequency signal IF, to the IF amplification section 250 over a signal line 249.

The IF amplification section 250 is for amplifying the intermediate-frequency signal IF provided by the mixture section 240. This IF amplification section 250 supplies the resulting amplified intermediate-frequency signal IF to the demodulation circuit 400 over a signal line 259.

The demodulation circuit 400 is for demodulating the intermediate-frequency signal IF provided by the reception circuit 200, e.g., for demodulation to obtain a baseband signal or others.

The reception apparatus is described to use the antenna 100 to wirelessly receive the reception signal RF, but this is not restrictive. The reception apparatus may receive the reception signal with a wired connection as long as the signal to be received is modulated.

[Configuration of Duty-Cycle Correction Section]

Figure 2:
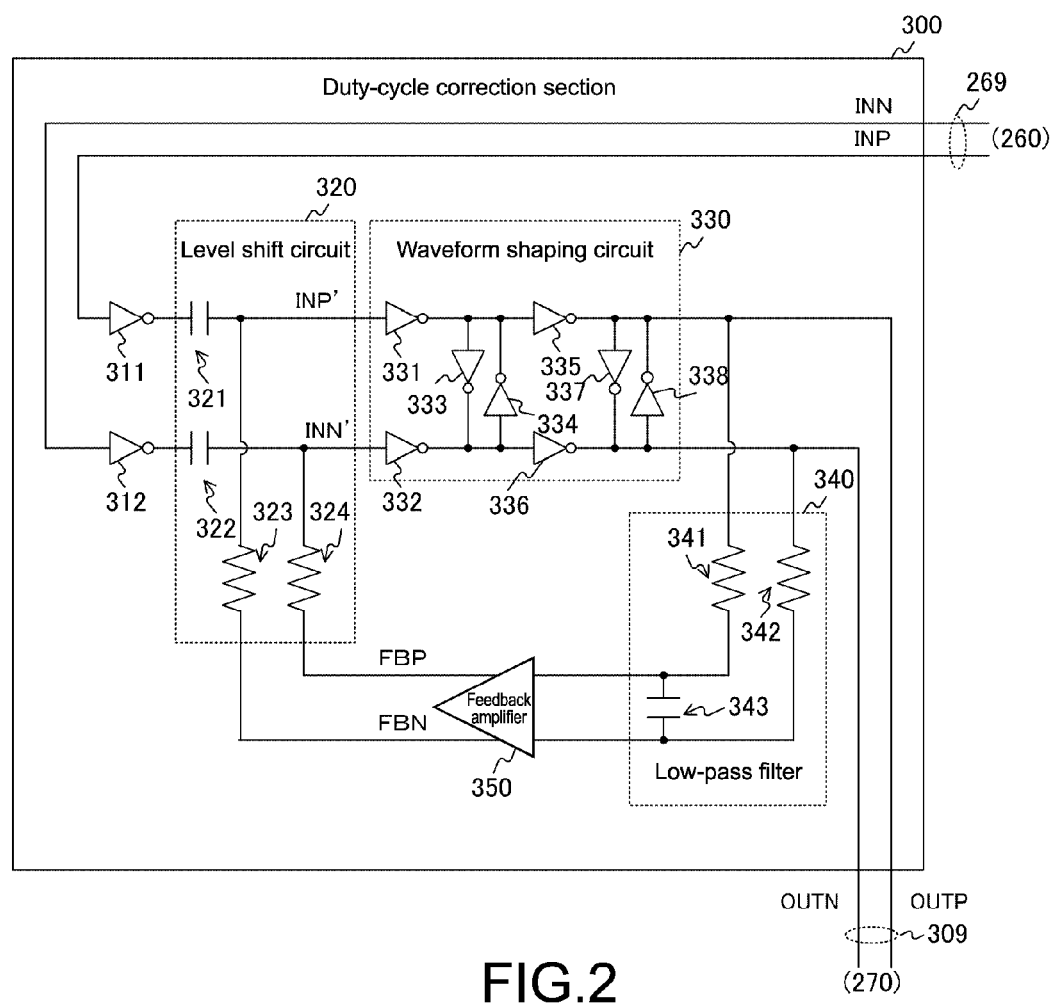
FIG. 2 is a circuit diagram showing an exemplary configuration of a duty-cycle correction section in the first embodiment.

FIG. 2 is a circuit diagram showing an exemplary configuration of the duty-cycle correction section 300 in the first embodiment. This duty-cycle correction section 300 includes inverters 311 and 312, a level shift circuit 320, a waveform shaping circuit 330, a low-pass filter 340, and a feedback amplifier 350. The level shift circuit 320 includes capacitors 321 and 322, and resistors 324 and 325. The waveform shaping circuit 330 includes inverters 331 to 338. The low-pass filter 340 includes resistors 341 and 342, and a capacitor 343.

The inverter 311 is for receiving a positive-phase component in the local signal LO1 as a positive-phase input signal INP, and reversing the phase thereof. This inverter 311 supplies the resulting phase-reversed positive-phase input signal INP to the level shift circuit 320. The inverter 312 is for receiving a negative-phase component in the local signal LO1 as a negative-phase input signal INN, and reversing the phase thereof. This inverter 312 supplies the resulting phase-reversed negative-phase input signal INN to the level shift circuit 320.

In the level shift circuit 320, the capacitor 321 is connected at one end to the inverter 311, and the other end is connected to both the resistor 323 and the inverter 331. The capacitor 322 is connected at one end to the inverter 312, and the other end is connected to both the resistor 324 and the inverter 332. The resistor 323 is connected at one end to both the capacitor 321 and the inverter 331, and the other end is connected to the feedback amplifier 350. The resistor 324 is connected at one end to both the capacitor 322 and the inverter 332, and the other end is connected to the feedback amplifier 350.

In the waveform shaping circuit 330, an input terminal of the inverter 331 is connected to both the capacitor 321 and the resistor 323, and an output terminal of the inverter 331 is connected to input terminals of the inverters 333 and 335 and to an output terminal of the inverter 334. An input terminal of the inverter 332 is connected to both the capacitor 322 and the resistor 324, and an output terminal of the inverter 332 is connected to an output terminal of the inverter 333 and to input terminals of the inverters 334 and 336.

An output terminal of the inverter 335 is connected to an input terminal of the inverter 337, an output terminal of the inverter 338, the resistor 341, and the phase shift section 270. An output terminal of the inverter 336 is connected to an output terminal of the inverter 337, an input terminal of the inverter 338, the resistor 342, and the phase shift section 270. With the waveform shaping circuit 330 in such a configuration, the incoming signals, i.e., the positive- and negative-phase input signals, are each changed from the sine-wave shape to the square-wave shape. The resulting signals, i.e., positive- and negative-phase output signals OUTP and OUTN, are output to the phase shift section 270.

In the low-pass filter 340, the resistors 341 and 342 are connected each at one end to both the waveform shaping circuit 330 and the phase shift section 270, and their other ends are connected to both the feedback amplifier 350 and the capacitor 343. The capacitor 343 is connected in parallel to the feedback amplifier 350.

The feedback amplifier 350 is for amplifying the signals provided via the low-pass filter 340, i.e., the positive- and negative-phase output signals OUTP and OUTN. After the amplification, the feedback amplifier 350 feeds back the resulting signals, i.e., positive- and negative-phase feedback signals FBP and FBN, to the level shift circuit 320. Herein, the feedback amplifier 350 is an example of a feedback section claimed in Claims.

The level shift circuit 320 configured as above combines the positive-phase input signal INP with the negative-phase feedback signal FBN for a voltage adjustment, and combines the negative-phase input signal INN with the positive-phase feedback signal FBP for a voltage adjustment. This adjusts the amplitude center voltage to be the same for both the positive- and negative-phase output signals OUTP and OUTN. Hereinafter, the positive- and negative-phase signals after such a voltage adjustment are respectively referred to as positive- and negative-phase input signals INP' and INN'. After the voltage adjustment, the duty cycle of the local signal LO1 is corrected to be 50%. Herein, the level shift circuit 320 is an example of a voltage adjustment section claimed in Claims.

With the waveform shaping circuit 330, the positive- and negative-phase input signals INP' and INN' are each changed from the sine-wave shape to the square-wave shape. The resulting signals, i.e., positive- and negative-phase output signals OUTP and OUTN, are output to both the low-pass filter 340 and the phase shift section 270. With the signals changed into the square-wave shape, the demodulation circuit 400 becomes able to perform a digital demodulation process on the intermediate-frequency signal IF. By these components, i.e., the waveform shaping circuit 330 and the low-pass filter 340, the delayed signals are supplied to the feedback amplifier 350. Herein, the waveform shaping circuit 330 and the low-pass filter 340 are each an example of a delay section claimed in Claims.

In the above, the duty-cycle correction section 300 corrects the duty cycle to be 50%, but the duty cycle may be corrected to fall within a fixed value range including 50%, i.e., about 50%.

Figure 3A:
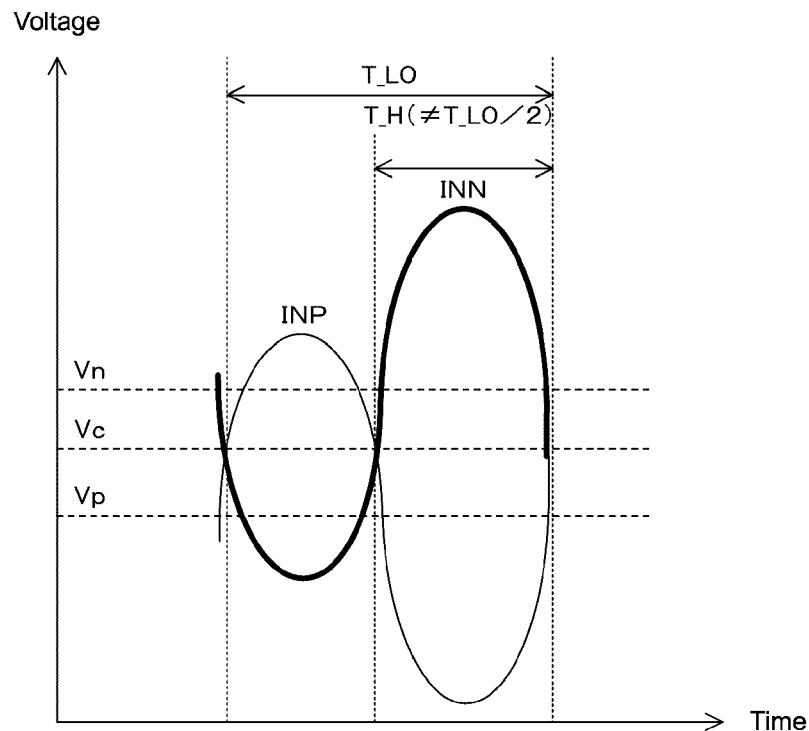
FIGS. 3A and 3B are diagrams respectively showing exemplary sinusoidal waveforms before and after the correction of a duty cycle in the first embodiment.
Figure 3B:
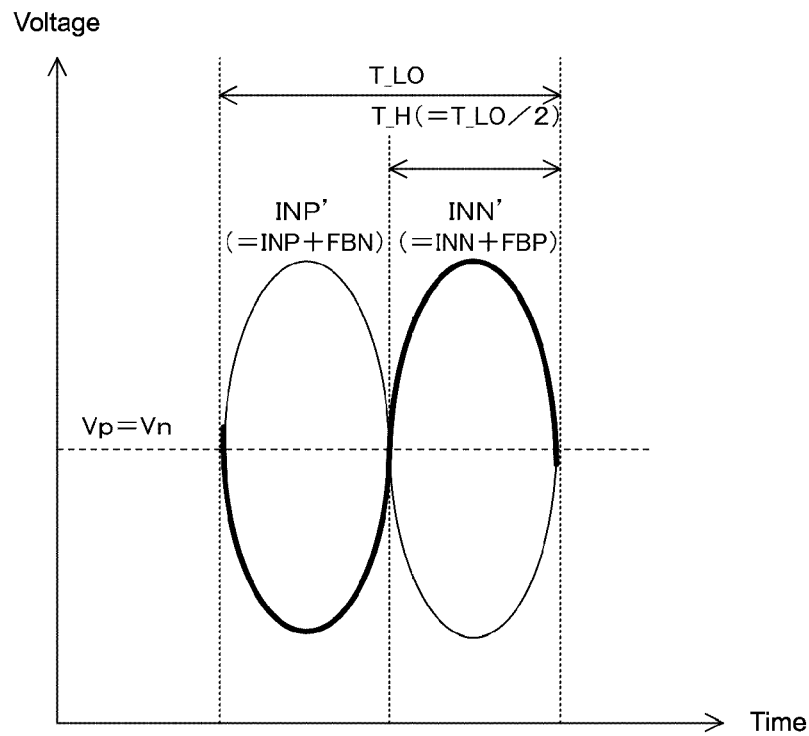

FIGS. 3A and 3B are diagrams respectively showing exemplary sinusoidal waveforms before and after the correction of a duty cycle in the first embodiment. In FIGS. 3A and 3B, the vertical axis indicates the voltage of a local signal, and the lateral axis indicates a time. The thin solid line indicates a positive-phase signal in the local signal, and the thick solid line indicates a negative-phase signal in the local signal. FIG. 3A specifically shows exemplary waveforms of the positive- and negative-phase input signals INP and INN before the correction of the duty cycle. In the waveforms exemplarily shown in FIG. 3A, due to the influence of an offset voltage or others, the amplitude center voltage, i.e., Vp, of the positive-phase input signal INP is different from the amplitude center voltage, i.e., Vn, of the negative-phase input signal INN. Therefore, assuming that the duty cycle is the ratio of T_H to a signal cycle where T_H denotes a period of time while the voltage takes a predetermined value or higher, the duty cycle is not 50% for both of the positive- and negative-phase input signals INP and INN.

FIG. 3B specifically shows exemplary waveforms of the positive- and negative-phase input signals INP' and INN' after the correction of the duty cycle. The positive-phase input signal INP is summed with the negative-phase feedback signal FBN, and the negative-phase input signal INN is summed with the positive-phase feedback signal FBP. After the signals are summed as above, the amplitude center voltage Vp of the phase input signal INP' is adjusted to be the same as the amplitude center voltage Vn of the negative-phase input signal INN' as shown in FIG. 3B. This accordingly corrects the duty cycle to be 50% for both of the positive- and negative-phase input signals INP' and INN'.

Figure 4A:
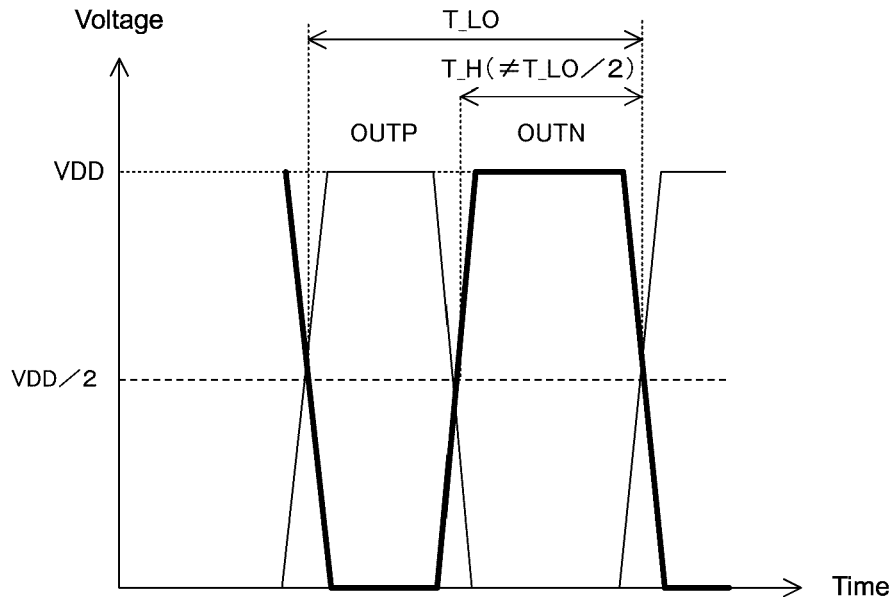
FIGS. 4A and 4B are diagrams respectively showing exemplary square waveforms before and after the correction of a duty cycle in the first embodiment.
Figure 4B:
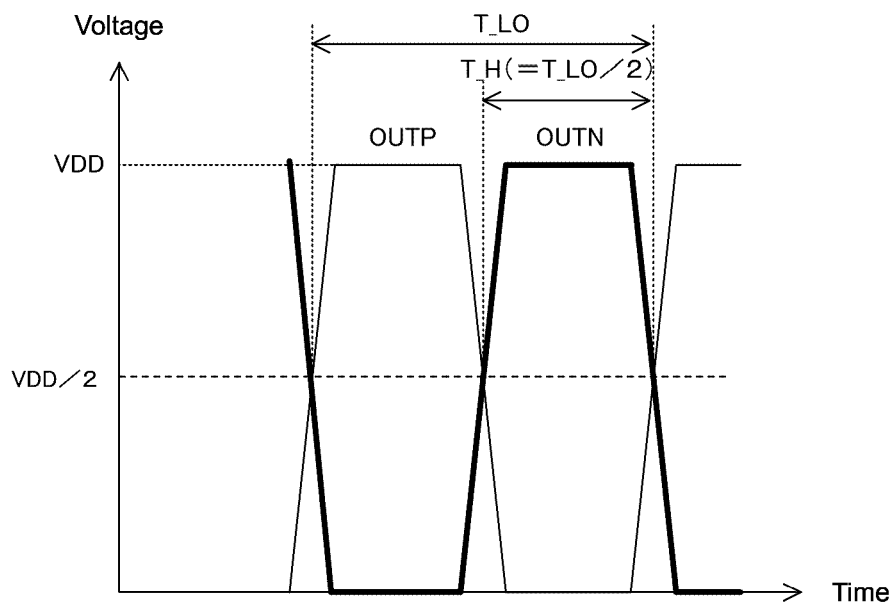

FIGS. 4A and 4B are diagrams respectively showing exemplary square waveforms before and after the correction of a duty cycle in the first embodiment. In FIGS. 4A and 4B, the vertical axis indicates the voltage of a local signal, and the lateral axis indicates a time. The thin solid line indicates a positive-phase signal in the local signal, and the thick solid line indicates a negative-phase signal in the local signal. FIG. 4A specifically shows an exemplary square waveform in a comparison example not including the duty-cycle correction section 300. If the sinusoidal waveform exemplarily shown in FIG. 3A is changed in shape to the square waveform with no correction of the duty cycle, the resulting square waves may not have the duty cycle of 50% as exemplarily shown in FIG. 4A.

FIG. 4B specifically shows exemplary square waves that are obtained by a shape change from the sine waves after the correction of the duty cycle. As exemplarily shown in FIG. 3B, the duty cycle of the positive- and negative-phase input signals INP' and INN' is corrected to be 50%. Therefore, as exemplarily shown in FIG. 4B, the duty cycle of the positive- and negative-phase output signals OUTP and OUTN also becomes 50%.

[Exemplary Configuration of Phase Shift Section]

Figure 5:
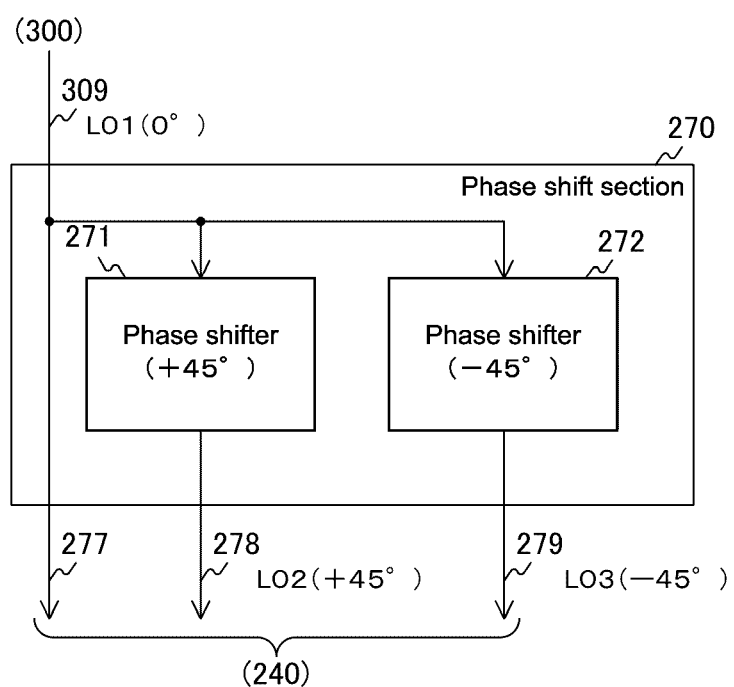
FIG. 5 is a block diagram showing an exemplary configuration of a phase shift section in the first embodiment.

FIG. 5 is a block diagram showing an exemplary configuration of the phase shift section 270 in the first embodiment. This phase shift section 270 includes phase shifters 271 and 272. The phase shifter 271 is for shifting the phase of the local signal LO1 by +45 degrees, and supplying the resulting local signal LO2 to the mixture section 240. The phase shifter 272 is for shifting the phase of the local signal LO1 by −45 degrees, and supplying the resulting local signal LO3 to the mixture section 240.

Herein, the phase shift section 270 is described to generate two local signals by shifting the phase of the local signal LO1 by ±45 degrees. This is not restrictive as long as the resulting two local signals and the local signal LO1 have a 45-degree phase difference from each other. As an example, the phase shift section 270 may generate two local signals by shifting the phase of the local signal LO1 by +45 and +90 degrees. Moreover, the phase shift section 270 is described above to generate two local signals with a phase difference therebetween and from the local signal LO1. This is not restrictive, and the phase shift section 270 may generate three or more local signals if harmonic reduction is possible thereby. As an example, the phase shift section 270 may generate local signals with four varying phase differences from the phase of the local signal LO1, e.g., phase differences of 0, 45, 90, and 135 degrees.

[Exemplary Configuration of Mixture Section]

Figure 6:
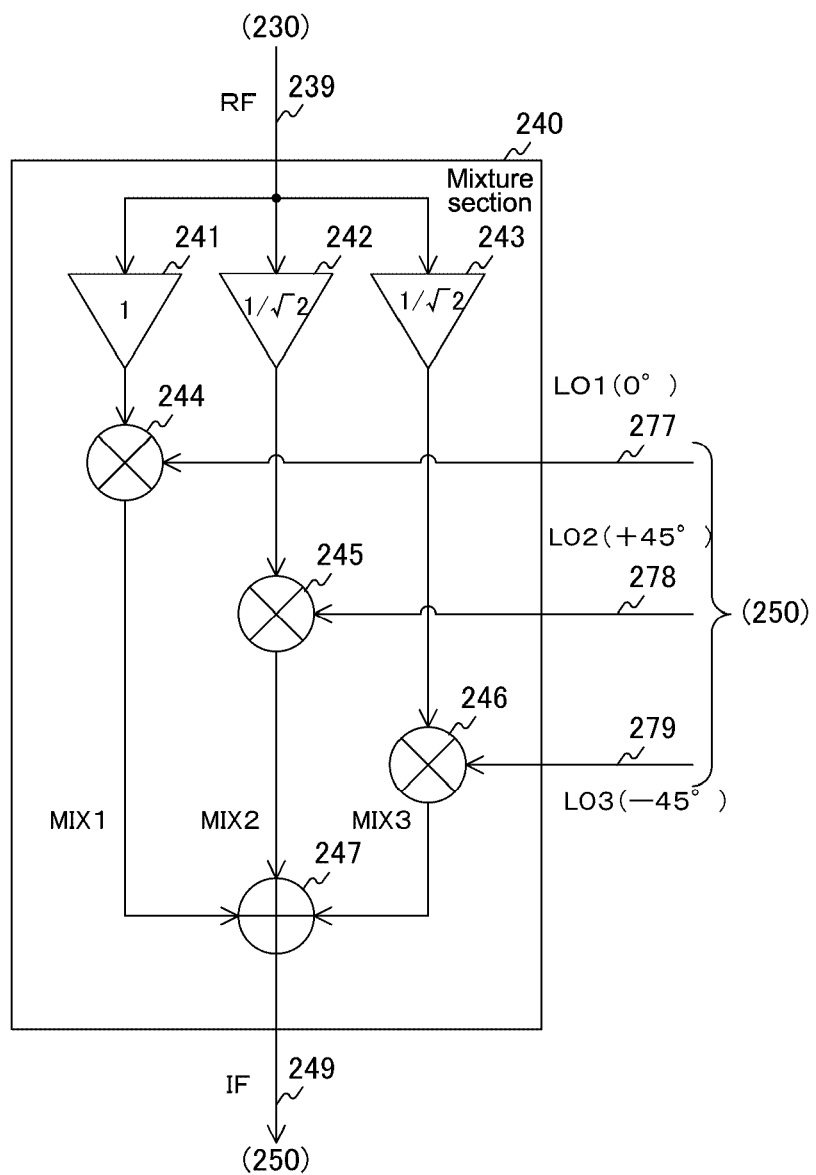
FIG. 6 is a block diagram showing an exemplary configuration of a mixture section in the first embodiment.

FIG. 6 is a block diagram showing an exemplary configuration of the mixture section 240 in the first embodiment. This mixture section 240 includes amplifiers 241, 242, and 243, mixers 244, 245, and 246, and a signal combiner 247.

The amplifier 241 is for amplifying the reception signal RF with a predetermined gain, and supplying the resulting signal to the mixer 244. The amplifier 242 is for amplifying the reception signal RF with a gain being $1/\sqrt{2}$-times the gain for the amplifier 241, and supplying the resulting signal to the mixer 245. The amplifier 243 is for amplifying the reception signal RF with a gain being $1/\sqrt{2}$-times the gain for the amplifier 241, and supplying the resulting signal to the mixer 246.

The mixer 244 is for mixing the reception signal RF from the amplifier 241 with the local signal LO1, and supplying the resulting signal, i.e., mixed signal MIX1, to the signal combiner 247. The mixer 245 is for mixing the reception signal RF from the amplifier 242 with the local signal LO2, and supplying the resulting signal, i.e., mixed signal MIX2, to the signal combiner 247. The mixer 246 is for mixing the reception signal RF from the amplifier 243 with the local signal LO3, and supplying the resulting signal, i.e., mixed signal MIX 3, to the signal combiner 247. These mixers 244, 245, and 246 are each configured by a multiplier, for example.

The signal combiner 247 is for combining together the mixed signals MIX1, MIX2, and MIX3, and supplying the resulting signal, i.e., intermediate-frequency signal IF, to the IF amplification section 250. The signal combiner 247 is configured by an adder, for example. By combining together the mixed signals that are obtained by mixing each of the three 45-degree-phase-different local signals with the reception signal RF, the resulting intermediate-frequency signal IF is prevented from containing harmonics.

Herein, the mixture section 240 is described to sum (combine) the mixed signals MIX1, MIX2, and MIX3 before making a signal supply to the demodulation circuit 400 via the IF amplification section 250. Alternatively, the mixture section 240 may make a signal supply to the demodulation circuit 400 without summing these mixed signals. If this is the case, the mixture section 240 is not expected to include the signal combiner 247, and the signal combiner 247 is provided to the demodulation circuit 400 or others.

Figure 7A:
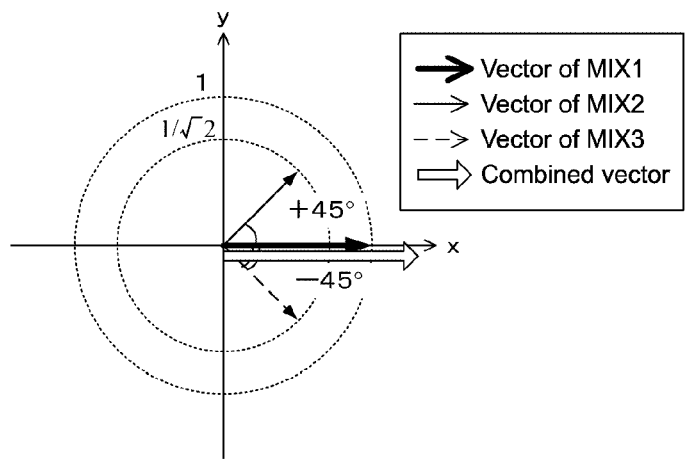
FIG. 7A is an exemplary vector diagram for fundamental waves in the first embodiment.
Figure 7B:
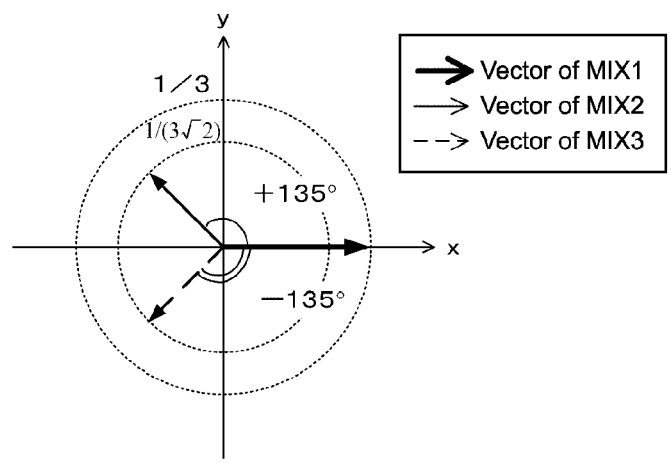
FIGS. 7B and 7C are each an exemplary vector diagram for harmonics in the first embodiment.
Figure 7C:
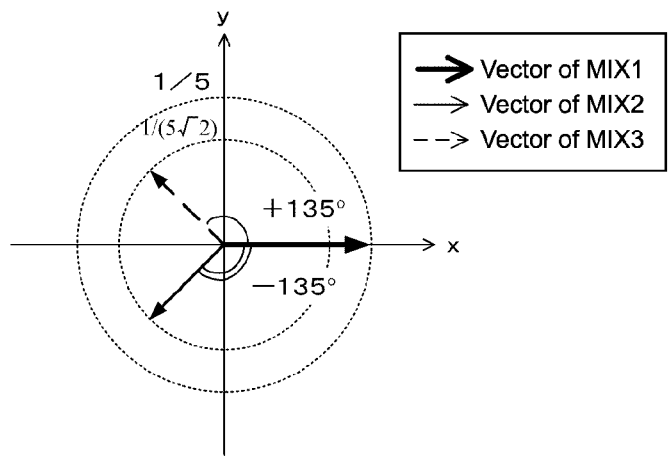

FIG. 7A is an exemplary vector diagram for fundamental waves in the first embodiment, and FIGS. 7B and 7C are each an exemplary vector diagram for harmonics in the first embodiment. In FIGS. 7A to 7C, the x axis indicates an in-phase component, and the y axis indicates an orthogonal component. The size of a vector arrow indicates the signal amplitude. The angle of the vector arrow with respect to the x axis indicates the phase of a signal, e.g., MIX1, MIX2, or MIX3, at a predetermined voltage relative to the phase of the local signal LO1 also at the predetermined voltage.

A function $S_{LO}$ of the square-wave local signal LO1 is expressed by Equation below using the Fourier series.

[Formula 1]

$$S_{LO} = \frac{4}{\pi} \sum_{k=1}^{\infty} \frac{\sin[(2k-1)(\omega t + \theta)]}{2k-1} \quad \text{Equation 2}$$

In Equation above, k denotes an integer, and t denotes a time in unit of second, for example. For the local signals LO2 and LO3, their wave function is similarly expressed by Equation 2 except that there is a phase difference of 45 degrees.

Based on Equation 1, a fundamental-wave vector of the intermediate-frequency signal IF is expressed by Equation below.

[Formula 2]

$$\frac{4}{\pi}\sin(\omega t + \theta) + \frac{2\sqrt{2}}{\pi}\sin\left(\omega t + \theta + \frac{\pi}{4}\right) + \frac{2\sqrt{2}}{\pi}\sin\left(\omega t + \theta - \frac{\pi}{4}\right) = \frac{8}{4}\sin(\omega t + \theta) \quad \text{Equation 3}$$

FIG. 7A is specifically an exemplary vector diagram for fundamental waves expressed by Equation 3. The thick solid arrow indicates a fundamental-wave vector of the mixed signal MIX1 corresponding to the local signal LO1. This vector is a graphical representation of the first term on the left side of Equation 3. The thin solid arrow indicates a fundamental-wave vector of the mixed signal MIX2 corresponding to the +45-degree-phase-shifted local signal LO2. This vector is a graphical representation of the second term on the left side of Equation 3.

The dotted arrow indicates a fundamental-wave vector of the mixed signal MIX3 corresponding to the −45-degree-phase-shifted local signal LO3. This vector is a graphical representation of the third term on the left side of Equation 3. The outlined arrow indicates a fundamental-wave vector of the intermediate-frequency signal IF. This vector is a graphical representation of the right side of Equation 3. This vector is a combination of the fundamental-wave vectors of the mixed signals MIX1, MIX2, and MIX3. This combined vector is longer in length than each of the combining fundamental-wave vectors, and this means that the fundamental waves are amplified.

A third-harmonic vector of the intermediate-frequency signal IF is obtained by Equation below based on Equation 1.

[Formula 3]

$$\frac{4}{3\pi}\sin(3\omega t + 3\theta) + \frac{2\sqrt{2}}{3\pi}\sin\left(2\omega t + 3\theta + \frac{3\pi}{4}\right) + \frac{2\sqrt{2}}{3\pi}\sin\left(3\omega t + 3\theta - \frac{3\pi}{4}\right) = 0 \quad \text{Equation 4}$$

Equation 4 shows that a vector being a combination of third-harmonic vectors of the mixed signals MIX1, MIX2, and MIX3 has the length of zero. This is because these combining third-harmonic vectors have a phase difference of 135 degrees from each other, and two of the combining vectors are opposite in direction from the remaining combining vector, thereby resulting in the same length. Therefore, the resulting intermediate-frequency signal IF is prevented from containing third-harmonics.

FIG. 7B is specifically an exemplary vector diagram for third harmonics expressed by Equation 4. The thick solid arrow indicates a third-harmonic vector of the mixed signal MIX1 corresponding to the local signal LO1. This vector is a graphical representation of the first term on the left side of Equation 4.

The thin solid arrow indicates a third-harmonic vector of the mixed signal MIX2 corresponding to the +45-degree-phase-shifted local signal LO2. This vector is a graphical representation of the second term on the left side of Equation 4.

The dotted arrow indicates a third-harmonic vector of the mixed signal MIX3 corresponding to the −45-degree-phase-shifted local signal LO1. This vector is a graphical representation of the third term on the left side of Equation 4.

A fifth-harmonic vector of the intermediate-frequency signal IF is expressed by Equation below based on Equation 1.

[Formula 4]

$$\frac{4}{5\pi}\sin(5\omega t + 5\theta) + \frac{2\sqrt{2}}{5\pi}\sin\left(5\omega t + 5\theta + \frac{5\pi}{4}\right) + \frac{2\sqrt{2}}{5\pi}\sin\left(5\omega t + 5\theta - \frac{5\pi}{4}\right) = 0 \quad \text{Equation 5}$$

Equation 5 shows that a vector being a combination of fifth-harmonic vectors of the mixed signals MIX1, MIX2, and MIX3 has the length of zero. Therefore, the resulting intermediate-frequency signal IF is prevented from containing fifth-harmonics.

FIG. 7C is specifically an exemplary vector diagram for fifth harmonics expressed by Equation 5. The thick solid arrow indicates a fifth-harmonic vector of the mixed signal MIX1 corresponding to the local signal LO1. This vector is a graphical representation of the first term on the left side of Equation 5. The thin solid arrow indicates a fifth-harmonic vector of the mixed signal MIX2 corresponding to the +45-degree-phase-shifted local signal LO2. This vector is a graphical representation of the second term on the left side of Equation 5.

The dotted arrow indicates a fifth-harmonic vector of the mixed signal MIX3 corresponding to the −45-degree-phaseshifted local signal LO3. This vector is a graphical representation of the third term on the left side of Equation 5.

As shown in FIGS. 7A to 7C, by combining together the mixed signals that are obtained by mixing each of the three 45-degree-phase-different local signals with the reception signal RF, the resulting signal is prevented from containing third or fifth harmonics.

Figure 8:
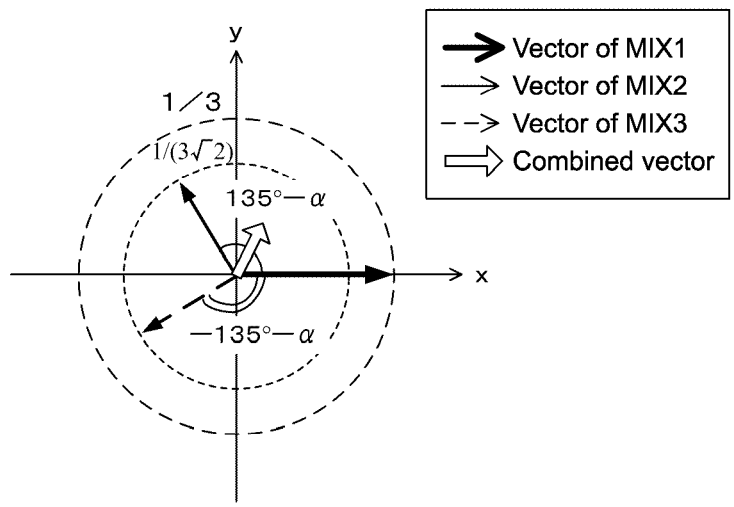
FIG. 8 is an exemplary vector diagram for third-order harmonics in a comparison example of the first embodiment.

FIG. 8 is an exemplary vector diagram for third harmonics in a comparison example of the first embodiment. In the configuration not including the duty-cycle correction section 300, the duty cycle of the local signals may not be 50% due to the influence of the offset voltage or others as described above. Such local signals do not have a phase difference of 45 degrees, and as to three mixed signals generated from such local signals, their third-harmonic vectors may not have a phase difference of 135 degrees from each other as exemplarily shown in FIG. 8. As a result, a vector being a combination of third-harmonic vectors of the three mixed signals does not have the length of zero, thereby failing to control the harmonics and causing degradation of the reception quality.

On the other hand, the configuration of including the duty-cycle correction section 300 controls the harmonics as exemplarily shown in FIGS. 7A to 7C so that the reception quality is improved. For generating local signals with a highly accurate duty cycle, generally expected is a relatively large-sized circuit or a power-consuming circuit. The local signal generation section 260 is thus increased in size or power consumption. However, the configuration of including the duty-cycle correction section 300 is able to correct the duty cycle even if the duty cycle does not take any desired value. The duty cycle is thus not expected to be highly accurate, and this eliminates having to increase the size or power consumption of the local signal generation section 260.

As described above, according to the first embodiment of the present disclosure, the reception circuit 200 mixes a reception signal with each of a plurality of duty-cycle-corrected local signals, thereby being able to control harmonics in the resulting mixed signals. The reception circuit 200 is thus able to improve the reception quality.

Modified Example

In the first embodiment, the reception circuit 200 is described to mix a reception signal with each of three local signals having a phase difference of 45 degrees. Alternatively, the reception circuit 200 may mix a reception signal with each of two local signals having a phase difference of 90 degrees. Such a mixture with 90-degree-phase different local signals is performed every time a quadrature-modulated signal is demodulated. Unlike in the first embodiment, the reception circuit 200 in the modified example mixes a reception signal with each of two local signals having a phase difference of 90 degrees.

Figure 9:
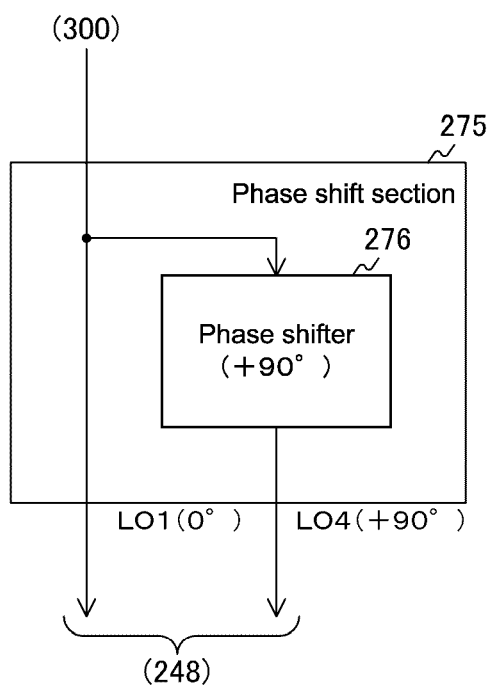
FIG. 9 is a block diagram showing an exemplary configuration of a phase shift section in a modified example of the first embodiment.

FIG. 9 is a block diagram showing an exemplary configuration of a phase shift section 275 in the modified example. This phase shift section 275 includes a phase shifter 276. The phase shifter 276 is for shifting the phase of a local signal LO1 by 90 degrees, and supplying the resulting local signal LO4.

Figure 10:
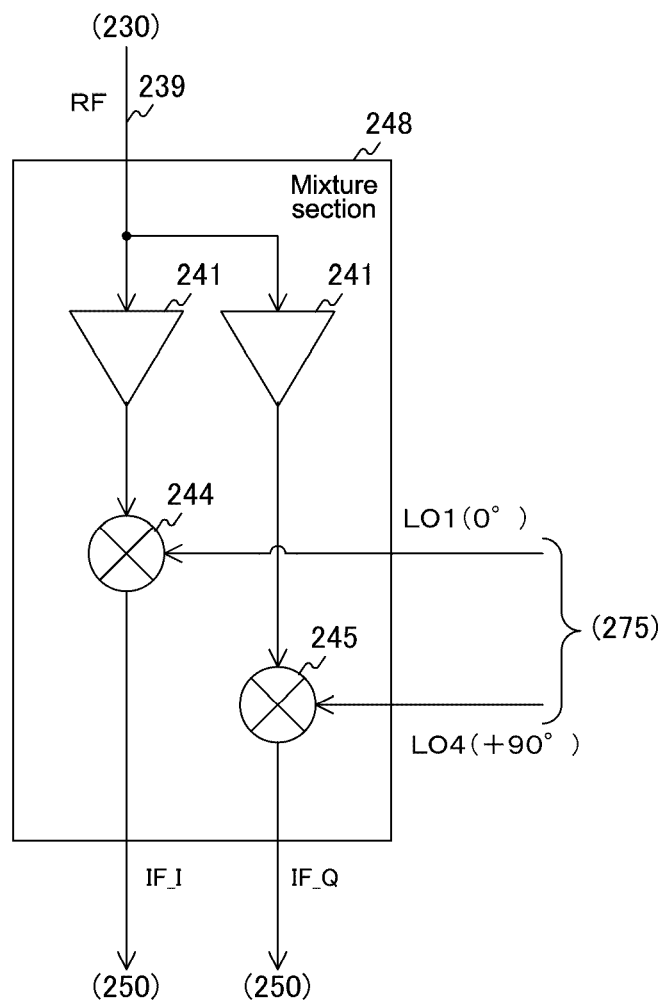
FIG. 10 is a block diagram showing an exemplary configuration of a mixture section in the modified example of the first embodiment.

FIG. 10 is a block diagram showing an exemplary configuration of a mixture section 248 in the modified example. This mixture section 248 includes two amplifiers 241, and mixers 244 and 245. One of the two amplifiers 241 amplifies a reception signal RF, and supplies the resulting amplified signal to the mixer 244. The remaining amplifier 241 also amplifies the reception signal RF, but supplies the resulting amplified signal to the mixer 245. The mixer 244 mixes the reception signal RF from one of the amplifiers 241 with the local signal LO1, and supplies the resulting mixed signal to the IF amplification section 250. The mixer 245 mixes the reception signal RF from the remaining amplifier 241 with the local signal LO4, and supplies the resulting mixed signal also to the IF amplifier 250. The demodulation circuit 400 in the modified circuit applies quadrature modulation on the signals coming from the reception circuit 200.

As described above, according to the modified example of the first embodiment, the reception circuit 200 is capable of appropriately demodulating any quadrature-modulated reception signals by mixing a reception signal with each of duty-cycle-corrected local signals with a phase difference of 90 degrees. Therefore, the reception circuit 200 may improve the reception quality.

2. Second Embodiment

In the first embodiment, the reception signal RF is described as having a fixed frequency, but when the reception apparatus is used in a tuner or others, the reception frequency may vary in a wide range of frequency bands. If the reception frequency is changed, the local frequency is also changed using Equation 1. Moreover, changing the local frequency causes the duty-cycle correction section 300 to change the rise and fall time of the local signals. The reception apparatus in the second embodiment is different from that in the first embodiment in this respect, i.e., changes the reception frequency by controlling the local frequency, and the rise and fall time of the local signals.

Figure 11:
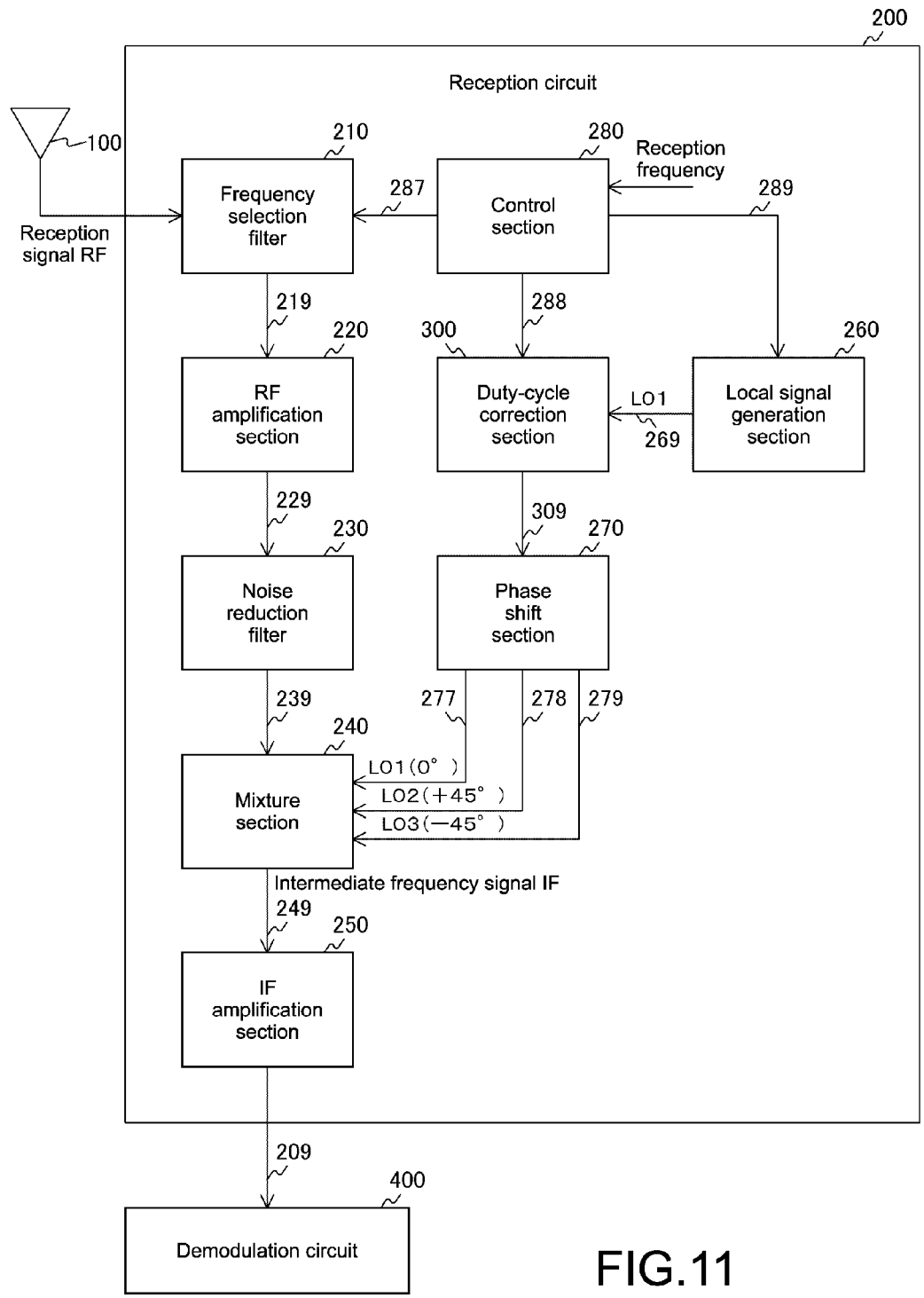
FIG. 11 is a block diagram showing an exemplary configuration of a reception apparatus in a second embodiment.

FIG. 11 is a block diagram showing an exemplary configuration of the reception apparatus in the second embodiment. Unlike in the first embodiment, the reception apparatus in the second embodiment further includes a control section 280 in the reception circuit 200.

The control section 280 is for controlling the components, i.e., the frequency selection filter 210, the duty-cycle correction section 300, and the local signal generation section 260. This control section 280 is provided with data about any specific reception frequency in a wide range of frequency bands. Upon reception of such data about the reception frequency, the control section 280 controls the frequency selection filter 210 to make it pass therethrough the reception frequency. The control section 280 also finds the local frequency corresponding to the reception frequency using Equation 1, and then controls the local signal generation section 260 to make it generate a local signal of the local frequency.

The control section 280 also controls the duty-cycle correction section 300 to make it change the rise and fall time of the local signal depending on the frequency of the local signal, i.e., the lower the local frequency, the longer the rise and fall time of the local signal.

Figure 12:
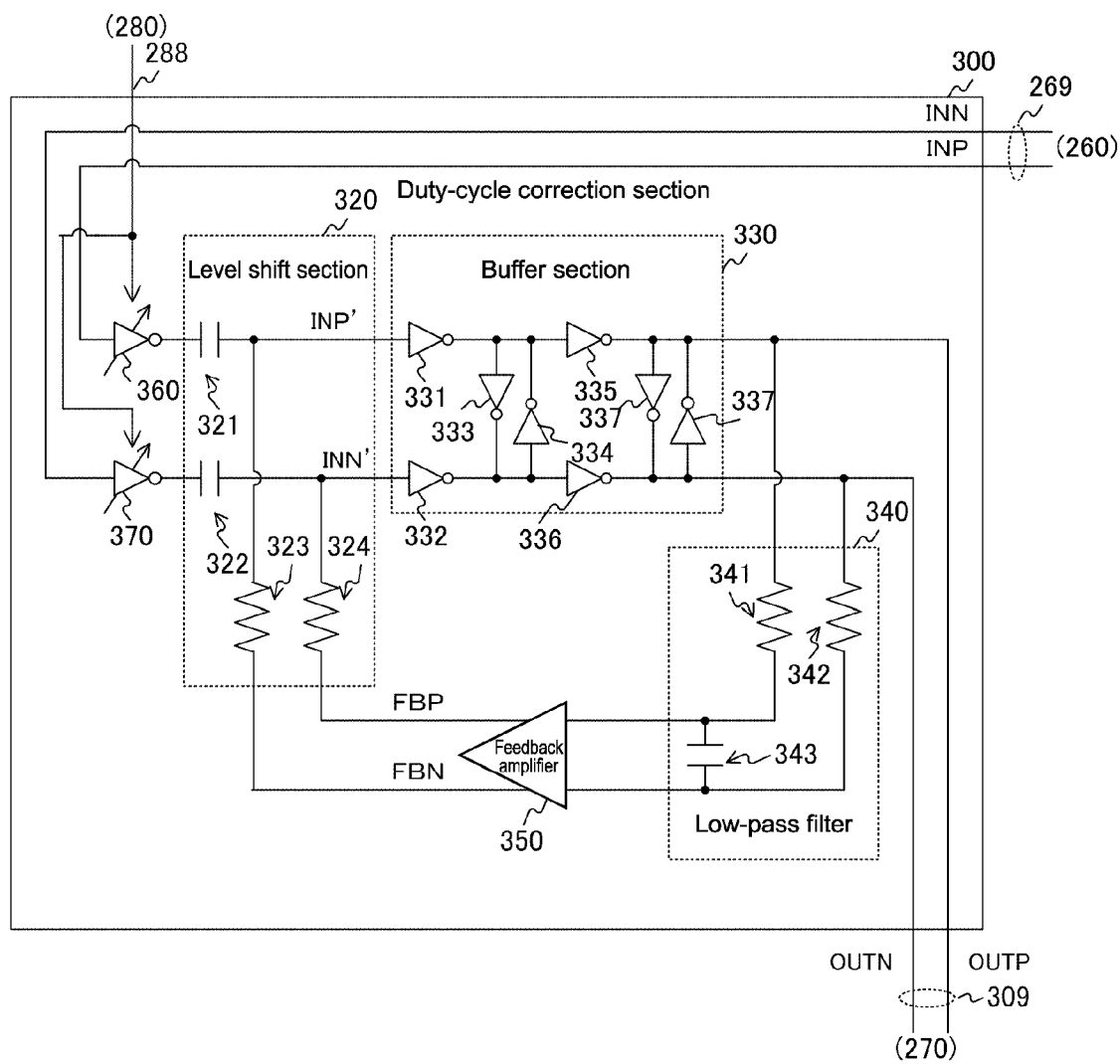
FIG. 12 is a circuit diagram showing an exemplary configuration of a duty-cycle correction section in the second embodiment.

FIG. 12 is a circuit diagram showing an exemplary configuration of the duty-cycle correction section 300 in the second embodiment. The duty-cycle correction section 300 in the second embodiment includes drive-power variable inverters 360 and 370 as alternatives to the inverters 311 and 312, which is the difference from that in the first embodiment.

The drive-power variable inverter 360 is for reversing the phase of the positive-phase input signal INP, and controls the current of the resulting phase-reversed positive-phase input signal INP under the control of the control section 280. The drive-power variable inverter 370 is for reversing the phase of the negative-phase input signal INN, and controls the current of the resulting phase-reversed negative-phase input signal INN under the control of the control section 280.

Herein, the slew rate of the positive-phase input signal INP' and that of the negative-phase input signal INN' change the duty-cycle correction range to be controlled by the level shift circuit 320. In consideration thereof, elements are used as buffers (360 and 370) in the preceding stage to generate the waveform with the slew rate appropriate to the duty-cycle correction range or others.

Equation below expresses a pulse width dt to be corrected, where $V_{DD}$ denotes a power supply voltage (volt; V), $t_{rf}$ denotes the rise and fall time (second) of a signal, and $V_{DD}/2$ denotes the possible range for a common voltage of differential signals.

$$dt = (V_{DD}/2) \times (t_{rf}/V_{DD}) \times 2 = t_{rf} \quad \text{Equation 6}$$

Based on Equation 6 above, a duty cycle dp to be corrected is expressed by Equation below.

$$dp = dt \times (1/T) \times = t_{rf} \times (1/T) \quad \text{Equation 7}$$

By Equation 7, the rise and fall time $t_{rf}$ is expected to be 100 picoseconds (ps) or more for a 10% correction of the duty cycle of a 1-gigahertz (GHz) local signal.

Considering the configuration of including buffers in the subsequent stage to increase the slew rate, it is not desirable to reduce the slew rate of the positive-phase input signal INP' and that of the negative-phase input signal INN' to be less than the slope of a sine wave.

As an example, the slope of a sine wave in the vicinity of a common voltage is expressed by Equation below.

[Formula 5]

$$\frac{d}{dt}\left[\frac{V_{DD}}{2}\sin(\omega t + \theta) + \frac{V_{DD}}{2}\right] = \omega \frac{V_{DD}}{2}\cos(\omega t + \theta) = \omega \frac{V_{DD}}{2} \quad \text{Equation 8}$$

Based on Equation 8, the time to be taken for a change of electric potential from 0 to $V_{DD}$ is expressed by Equation below.

[Formula 6]

$$V_{DD} \times \frac{2}{V_{DD}\omega} = \frac{1}{\pi f} \quad \text{Equation 9}$$

By Equation 9, the rise and fall time $t_{rf}$ is desirably expected to be 318 picoseconds (ps) or less for correcting the duty cycle of a 1-gigahertz (GHz) local signal.

The elements generating the waveform with the slew rate in a range determined by the above-mentioned desirable rise and fall time $t_{rf}$, i.e., $V_{DD}/t_{rf}$, are used as the buffers (360 and 370) in the preceding stage.

Figure 13:
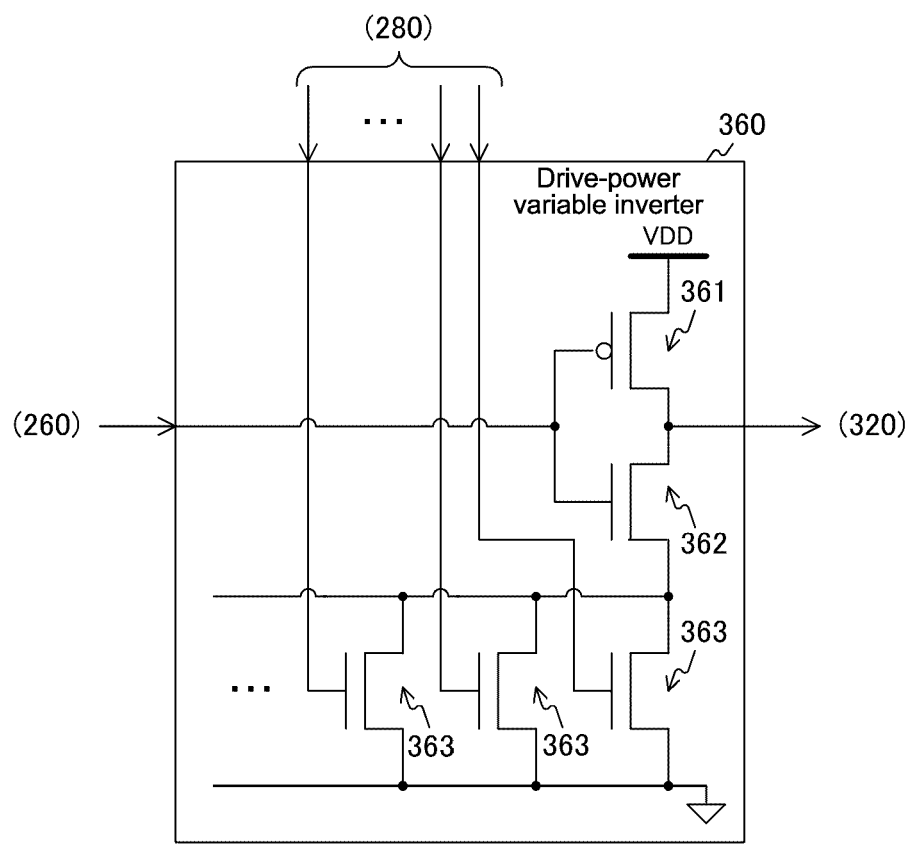
FIG. 13 is a circuit diagram showing an exemplary configuration of a drive-power variable inverter in the second embodiment.

FIG. 13 is a circuit diagram showing an exemplary configuration of a drive-power variable inverter 360 in the second embodiment. The drive-power variable inverter 360 includes transistors 361 and 362, and a plurality of transistors 363. The transistor 361 is exemplified by a p-type MOS (Metal-Oxide-Semiconductor) transistor. The transistors 362 and 363 are each exemplified by an n-type MOS transistor. The drive-power variable inverter 370 is configured similarly to the drive-power variable inverter 360.

In the transistor 361, the source terminal is connected to both the transistor 362 and the level shift circuit 320, the gate terminal is connected to the local signal generation section 260, and the drain terminal is applied with a power supply voltage. In the transistor 362, the source terminal is connected to both the transistor 361 and the level shift circuit 320, the gate terminal is connected to the local signal generation section 260, and the drain terminal is connected to the transistors 363.

The source terminals of the transistors 363 are commonly connected to the transistor 362, the gate electrodes thereof are connected to the control section 280, and the drain terminals are each applied with a reference voltage that is lower than the power supply voltage.

The transistors 361 and 362 configured as above each reverse the phase of the signals from the local signal generation section 260, and output the resulting signals to the level shift circuit 320. The transistors 363 are each changed in state from/to ON to/from OFF under the control of the control section 280. This accordingly changes the combined resistance in the transistor 362, thereby increasing or decreasing the drive current for the drive-power variable inverter 360.

Assuming here is a case that the control section 280 changes the number of the transistors 363 to turn ON, i.e., the lower the frequency of the local signal, the fewer the number of the transistors 363 to be turned ON. The fewer the number of transistors 363 being turned ON, the larger the combined resistance thereof becomes. This accordingly reduces the partial pressure of the transistors 361 and 362 so that the drive current is reduced. The reduced drive current increases the rise and fall time $t_{rf}$ in Equation 7 so that the duty-cycle correction range is increased.

As described above, according to the second embodiment, the reception circuit 200 increases the rise and fall time of a local signal with a decrease of the local frequency. The reception circuit 200 thus can perform frequency conversion appropriately to reception signals in a wide range of frequency bands.

3. Third Embodiment

In the first embodiment, the delay in the duty-cycle correction section 300 is described as being fixed, but the rise and fall time may vary due to variations in processes or others. Unlike in such a first embodiment, the reception circuit 200 in the third embodiment 200 controls the rise and fall time to fall within an acceptable range.

Figure 14:
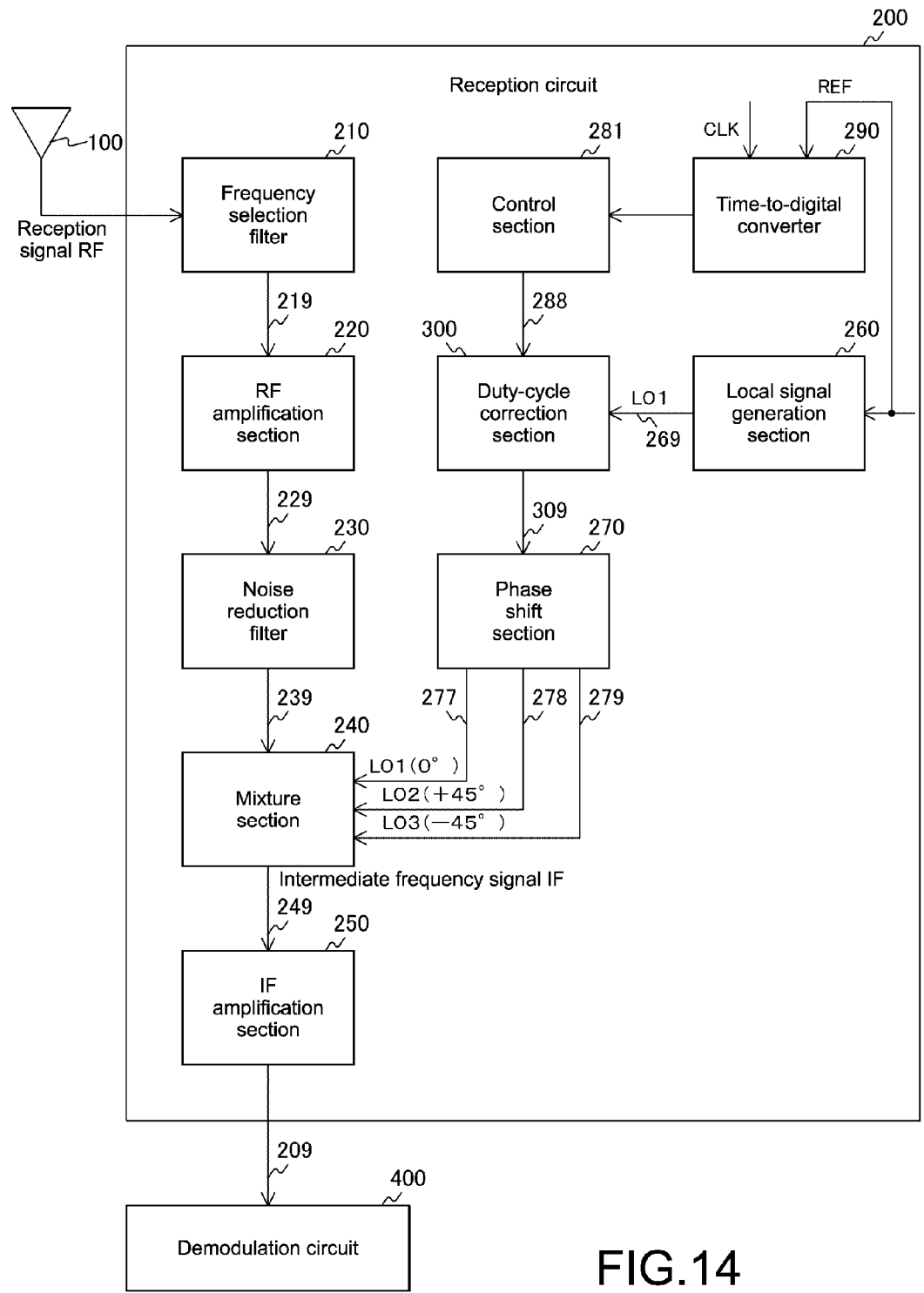
FIG. 14 is a block diagram showing an exemplary configuration of a reception apparatus in a third embodiment.

FIG. 14 is a block diagram showing an exemplary configuration of the reception apparatus in the third embodiment. Unlike in the first embodiment, the reception apparatus in the third embodiment further includes a control section 281, and a time-to-digital converter 290. The duty-cycle correction section 300 in the third embodiment is configured similarly to that in the second embodiment.

The time-to-digital converter 290 is for measuring the phase of a reference clock signal REF at a rising or falling edge using a high-speed clock signal CLK. The reference clock signal REF is used for generating a local signal in the local signal generation section 260. The high-speed clock signal CLK is higher in frequency than the reference clock signal REF.

The control section 281 is for controlling the duty-cycle correction section 300 based on the measurement value obtained by the time-to-digital converter 290. The details about control by the control section 281 will be described later.

Figure 15:
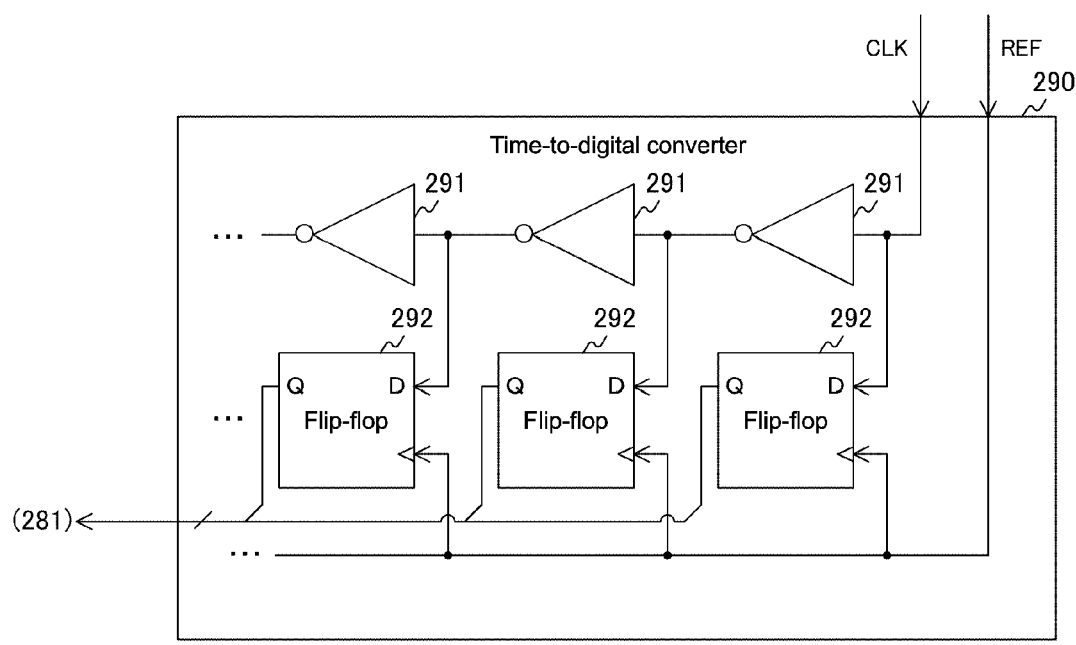
FIG. 15 is a circuit diagram showing an exemplary configuration of a time-to-digital converter in the third embodiment.

FIG. 15 is a circuit diagram showing an exemplary configuration of the time-to-digital converter 290 in the third embodiment. This time-to-digital converter 290 includes inverters 291 on a plurality of stages. In the time-to-digital converter 290, each of the inverters 291 includes a flip-flop 292.

The inverters 291 are each for reversing the phase of an input signal. The inverter 291 on the first stage is provided with a not-yet-delayed high-speed clock signal CLK. The inverters 291 each reverse the phase of the input signal, and supply the resulting signal to the inverter 291 on its subsequent stage and to the flip-flop corresponding thereto.

The flip-flops 292 are each for retaining the value of the high-speed clock signal CLK from the corresponding inverter 291 in synchronization with the reference clock signal REF. These flip-flops 292 are provided with the high-speed clock signals varying in delay. The flop-flops 292 also each supply the retained value to the control section 281. These values retained by the flip-flops 292, i.e., measurement data, indicate the phase of the reference clock signal REF at a rising or falling edge.

Using the measurement data and the known frequency of the reference clock signal REF, the control section 281 estimates a delay in each of the buffers (the inverters 291) in the time-to-digital converter 290. The delay in the buffer varies depending on variations in a manufacturing process of the reception circuit 200. When the delay in the inverters 291 does not fall within a predetermined range, the control section 281 estimates that the degree of variation is large, and the rise and fall time of the local signal in the duty-cycle correction section 300 is not in the acceptable range. Therefore, when determining that the estimated value of delay is not within the predetermined range, the control section 281 controls the drive-power variable inverters 360 and 370 based on the delay. As an example, the control section 281 increases the drive current for the drive-power variable inverter 360 or others with an increase of the delay in the inverters 291 so as to reduce the rise and fall time of the local signal. This accordingly controls the rise and fall time of the local signal to be within the acceptable range.

As described above, according to the third embodiment, the reception circuit 200 controls the rise and fall time in the duty-cycle correction section 300 to be within an acceptable range. Therefore, even if the rise and fall time takes a value not in the acceptable range due to the product-to-product variation, the duty cycle is appropriately corrected.

4. Fourth Embodiment

In the first embodiment, a delay in the duty-cycle correction section 300 is described as being fixed, but the local frequency may vary with a temperature change in the reception circuit 200 caused by the characteristics of the elements and circuits in the local signal generation section 260. If the local frequency is changed, the reception circuit 200 is expected to control the rise and fall time of a local signal in response to the change. Unlike in the first embodiment, the reception circuit 200 in the fourth embodiment controls the rise and fall time based on a temperature.

Figure 16:
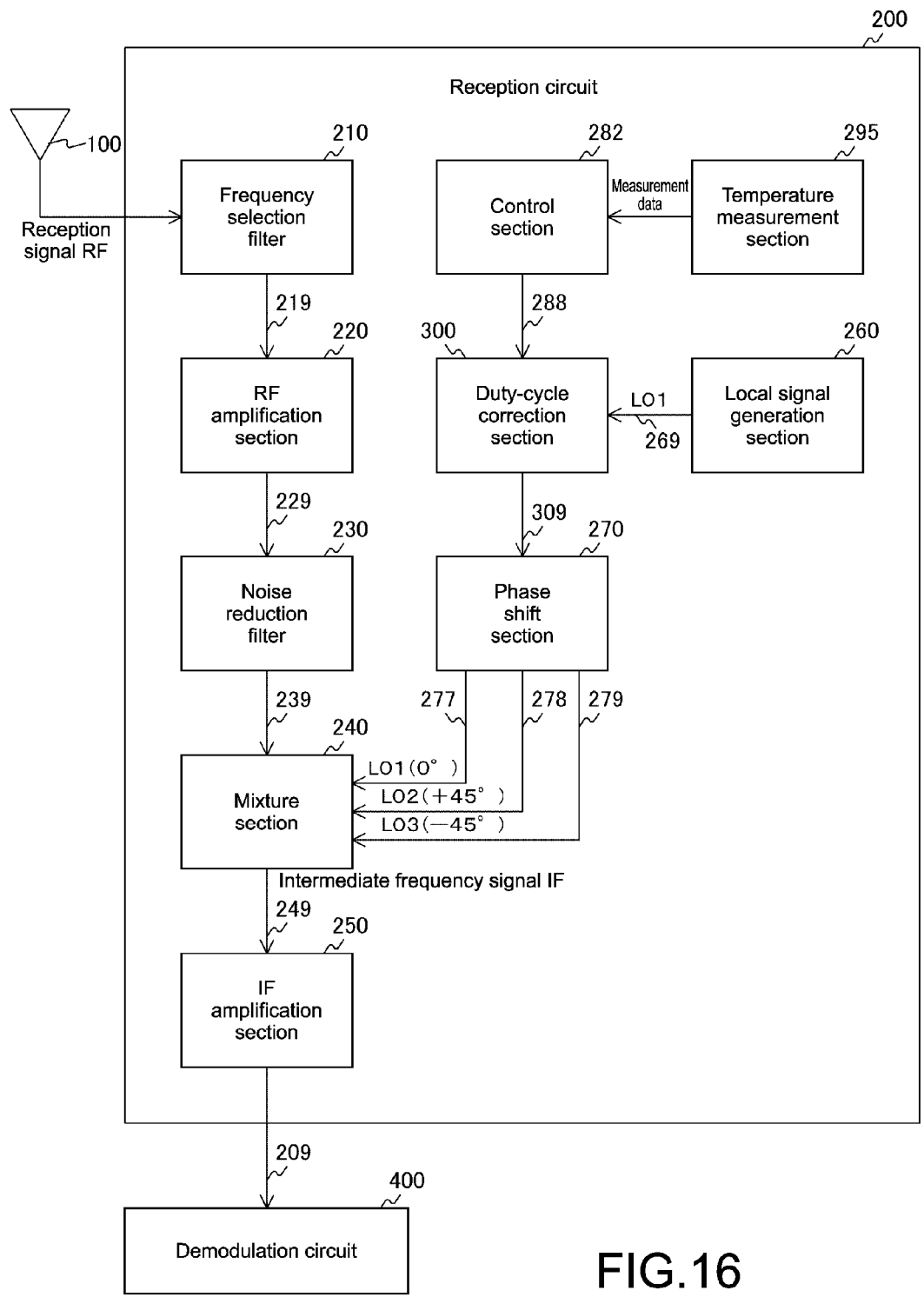
FIG. 16 is a block diagram showing an exemplary configuration of a reception apparatus in a fourth embodiment.

FIG. 16 is a block diagram showing an exemplary configuration of the reception apparatus in the fourth embodiment. Unlike in the first embodiment, the reception circuit in the fourth embodiment further includes a control section 282, and a temperature measurement section 295. The duty-cycle correction section 300 in the fourth embodiment is configured similarly to that in the second embodiment.

The temperature measurement section 295 is for measuring an environmental temperature of the reception circuit 200. The temperature measurement section 295 supplies the measurement results, i.e., measurement data, to the control section 282.

The control section 282 is for controlling a delay in the duty-cycle correction section 300 based on the temperature of the reception circuit 200. As an example, when the local signal generation section 260 has properties of reducing a local frequency with an increase of the temperature, the control section 282 increases the rise and fall time of a local signal by reducing a drive current with an increase of the temperature.

Figure 17:
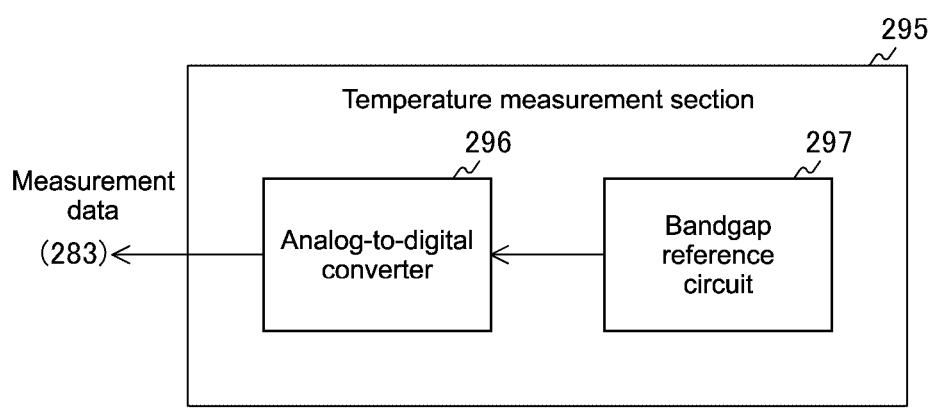
FIG. 17 is a block diagram showing an exemplary configuration of a temperature measurement section in the fourth embodiment.

FIG. 17 is a block diagram showing an exemplary configuration of the temperature measurement section 295 in the fourth embodiment. This temperature measurement section 295 includes an analog-to-digital converter 296, and a bandgap reference circuit 297.

The bandgap reference circuit 297 is for supplying a temperature-dependent output voltage. The analog-to-digital converter 296 is for converting the output voltage from the bandgap reference circuit 297 into digital measurement data, and supplying the data to the control section 282. Herein, the bandgap reference circuit 297 is used for the temperature measurement, but this is not restrictive. Alternatively, any other capable circuit or element may be also used for the temperature measurement, e.g., a thermistor that shows a change of resistance value depending on the temperature.

As described above, according to the fourth embodiment, the temperature is used as a basis to control the rise and fall time. Therefore, even if the frequency of a local signal is changed due to a temperature change, the duty cycle is corrected to take an appropriate value.

The embodiments described above are by way of examples only, and the matters in the embodiments have correspondences with the matters claimed in Claims to specify the present disclosure. Similarly, the matters claimed in Claims to specify the present disclosure have correspondences with the matters in the embodiments of the present disclosures under the same designations. While the present disclosure has been described in detail, the foregoing description is in all aspects illustrative and not restrictive. It is understood that numerous other modifications and variations can be devised without departing from the scope of the present disclosure.

While the effects have been described, the foregoing description is in all aspects illustrative and not restrictive. It is understood that other effects described in the Specification are also applicable.

The present disclosure may be also in the following structures.

(1) A reception circuit, including:

a local signal generation section configured to generate a local signal, the local signal being different in frequency from a modulated reception signal;

a duty-cycle correction section configured to correct a duty cycle of the generated local signal to be a predetermined value;

an oscillation signal generation section configured to generate a plurality of oscillation signals, the oscillation signals being generated using the duty-cycle-corrected local signal to vary in phase; and a mixture section configured to mix the reception signal with each of the oscillation signals.

(2) The reception circuit according to (1), in which the oscillation signal generation section generates the oscillation signals with a phase difference of 45 degrees from each other.

(3) The reception circuit according to (1), in which
the oscillation signal generation section generates the oscillation signals with a phase difference of 90 degrees from each other.

(4) The reception circuit according to any one of (1) to (3), in which
the local signal includes a positive-phase signal and a negative-phase signal, the negative-phase signal having a phase difference of 180 degrees from the positive-phase signal, and
the duty-cycle correction circuit includes
a delay section configured to delay the positive- and negative-phase signals,
a feedback section configured to feed back the delayed positive- and negative-phase signals, and
a voltage adjustment section configured to make a voltage adjustment on the positive- and negative-phase signals, the positive-phase signal being adjusted in voltage by the fed-back negative-phase signal, and the negative-phase signal being adjusted in voltage by the fed-back positive-phase signal.

(5) The reception circuit according to any one of (1) to (4), further including
a control section configured to control a rise and fall time of each of the positive- and negative-phase signals.

(6) The reception circuit according to (5), in which
the control section increases the rise and fall time with a decrease of the frequency of the local signal.

(7) The reception circuit according to (5) or (6), in which
the control section obtains the rise and fall time, and when the obtained value of the time does not fall within a predetermined acceptable range, controls the value of the time to fall within the acceptable range.

(8) The reception circuit according to any one of (5) to (7), further including
a temperature measurement section configured to measure a temperature of the reception circuit, wherein
the control section controls the rise and fall time based on the measured temperature.

(9) A reception apparatus, including:
a local signal generation section configured to generate a local signal, the local signal being different in frequency from a modulated reception signal;
a duty-cycle correction section configured to correct a duty cycle of the generated local signal to be a predetermined value;
an oscillation signal generation section configured to generate a plurality of oscillation signals, the oscillation signals being generated using the duty-cycle-corrected local signal to vary in phase; and
a mixture section configured to mix the reception signal with each of the oscillation signals.

It should be understood by those skilled in the art that various modifications, combinations, sub-combinations and alterations may occur depending on design requirements and other factors insofar as they are within the scope of the appended claims or the equivalents thereof.

What is claimed is:
1. A reception circuit, comprising:
a local signal generation section configured to generate a local signal having a different frequency than a frequency of a reception signal;
a duty-cycle correction section configured to correct a duty cycle of the generated local signal to a predetermined value;
an oscillation signal generation section configured to generate one or more oscillation signals by varying a phase of the duty-cycle-corrected local signal; and
a mixture section configured to mix the reception signal with each of the one or more oscillation signals and the duty-cycle-corrected local signal.

2. The reception circuit according to claim 1, wherein the oscillation signal generation section is further configured to generate the one or more oscillation signals with a phase difference of 45 degrees from each other.

3. The reception circuit according to claim 1, wherein the oscillation signal generation section is further configured to generate the one or more oscillation signals with a phase difference of 90 degrees from the phase of the duty-cycle-corrected local signal.

4. The reception circuit according to claim 1, wherein the local signal includes a positive-phase signal and a negative-phase signal, wherein a phase of the negative-phase signal has a phase difference of 180 degrees from a phase of the positive-phase signal, and
the duty-cycle correction circuit includes
a delay section configured to delay the positive-phase signal and the negative-phase signal,
a feedback section configured to feedback the delayed positive-phase signal and the delayed negative-phase signal, and
a voltage adjustment section configured to make a voltage adjustment on the positive-phase signal and the negative-phase signal, wherein the positive-phase signal is adjusted in voltage by the feedback of the delayed negative-phase signal, and wherein the negative-phase signal is adjusted in voltage by the feedback of the delayed positive-phase signal.

5. The reception circuit according to claim 4, further comprising a control section configured to control a rise and fall time of the positive-phase signal and the negative-phase signal.

6. The reception circuit according to claim 5, wherein the control section is further configured to increase the rise and fall time by decreasing the frequency of the local signal.

7. The reception circuit according to claim 5, wherein the control section is further configured to
determine a value of the rise and fall time, and
responsive to determining that the value of the rise and fall time does not fall within a predetermined acceptable range, control the frequency of the local signal until the value of the rise and fall time is within the predetermined acceptable range.

8. The reception circuit according to claim 5, further comprising
a temperature measurement section configured to measure a temperature of the reception circuit, wherein the control section is further configured to control the rise and fall time based on the measured temperature.

9. A reception apparatus, comprising:
a local signal generation section configured to generate a local signal having a different frequency than a frequency of a reception signal;
a duty-cycle correction section configured to correct a duty cycle of the generated local signal to a predetermined value;
an oscillation signal generation section configured to generate one or more oscillation signals by varying a phase of the duty-cycle-corrected local signal; and
a mixture section configured to mix the reception signal with each of the one or more oscillation signals and the duty-cycle-corrected local signal.

10. The reception apparatus according to claim 9, wherein the oscillation signal generation section is further configured to generate the one or more oscillation signals with a phase difference of 45 degrees from each other.

11. The reception apparatus according to claim 9, wherein the oscillation signal generation section is further configured to generate the one or more oscillation signals with a phase difference of 90 degrees from the phase of the duty-cycle-corrected local signal.

12. The reception apparatus according to claim 9, wherein the local signal includes a positive-phase signal and a negative-phase signal, wherein a phase of the negative-phase signal has a phase difference of 180 degrees from a phase of the positive-phase signal, and
the duty-cycle correction circuit includes
a delay section configured to delay the positive-phase signal and the negative-phase signal,
a feedback section configured to feedback the delayed positive-phase signal and the delayed negative-phase signal, and
a voltage adjustment section configured to make a voltage adjustment on the positive-phase signal and the negative-phase signal, wherein the positive-phase signal is adjusted in voltage by the feedback of the delayed negative-phase signal, and wherein the negative-phase signal is adjusted in voltage by the feedback of the delayed positive-phase signal.

13. The reception apparatus according to claim 12, further comprising
a control section configured to control a rise and fall time of the positive-phase signal and the negative-phase signal.

14. The reception apparatus according to claim 13, wherein the control section is further configured to increase the rise and fall time by decreasing the frequency of the local signal.

15. The reception apparatus according to claim 13, wherein the control section is further configured to
determine a value of the rise and fall time, and
responsive to determining that the value of the rise and fall time does not fall within a predetermined acceptable range, control the frequency of the local signal until the value of the rise and fall time is within the predetermined acceptable range.

16. The reception apparatus according to claim 13, further comprising
a temperature measurement section configured to measure a temperature of the reception circuit, wherein the control section is further configured to control the rise and fall time based on the measured temperature.

* * * * *